United States Patent
Cole et al.

(10) Patent No.: US 6,498,725 B2
(45) Date of Patent: Dec. 24, 2002

(54) METHOD AND TWO-PHASE SPRAY COOLING APPARATUS

(75) Inventors: Gregory S. Cole, Melbourne, FL (US); Robert P. Scaringe, Rockledge, FL (US)

(73) Assignee: Mainstream Engineering Corporation, Rocklege, FL (US)

( * ) Notice: Subject to any disclaimer, the term of this patent is extended or adjusted under 35 U.S.C. 154(b) by 0 days.

(21) Appl. No.: 09/845,337

(22) Filed: May 1, 2001

(65) Prior Publication Data

US 2002/0163782 A1 Nov. 7, 2002

(51) Int. Cl.[7] ................................................. H05K 7/20
(52) U.S. Cl. ...................... 361/700; 361/699; 361/701; 257/714; 257/715; 174/15.1; 165/80.4; 165/104.21; 165/104.22; 165/104.31; 165/104.33
(58) Field of Search ................................. 361/698–700; 257/714–716; 174/15.1, 15.2; 165/80.4, 104.33

(56) References Cited

U.S. PATENT DOCUMENTS

| | | | | |
|---|---|---|---|---|
| 3,774,677 A | * | 11/1973 | Antonetti et al. | 165/285 |
| 3,989,102 A | * | 11/1976 | Jaster et al. | 165/14.31 |
| 4,149,134 A | * | 4/1979 | Kothmann et al. | 336/57 |
| 4,759,403 A | * | 7/1988 | Flint et al. | 165/80.4 |
| 4,912,600 A | * | 3/1990 | Jaeger et al. | 361/700 |
| 5,183,104 A | | 2/1993 | Novonty | |
| 5,220,804 A | | 6/1993 | Tilton et al. | |
| 5,412,536 A | | 5/1995 | Anderson et al. | |
| 5,515,910 A | * | 5/1996 | Hamilton et al. | 165/30 |
| 5,535,818 A | * | 7/1996 | Fujisaki et al. | 165/104.33 |
| 5,719,444 A | * | 2/1998 | Tilton et al. | 257/714 |
| 5,768,103 A | * | 6/1998 | Kobrinetz et al. | 361/699 |
| 5,818,692 A | | 10/1998 | Denney, Jr. et al. | |
| 5,831,824 A | | 11/1998 | McDunn et al. | |
| 5,862,675 A | | 1/1999 | Scaringe et al. | |
| 5,907,473 A | | 5/1999 | Przilas et al. | |
| 5,924,482 A | | 7/1999 | Edwards et al. | |
| 6,018,192 A | | 1/2000 | Root et al. | |
| 6,108,201 A | | 8/2000 | Tilton et al. | |

OTHER PUBLICATIONS

Arthur H. Lefebvre, *Atomization and Sprays*, 1978, pp. 4–9, Table 1.1, and pp. 105–123.

* cited by examiner

Primary Examiner—Boris Chervinsky
(74) Attorney, Agent, or Firm—Crowell & Moring LLP

(57) ABSTRACT

A compact, lightweight, and efficient evaporative spray cooling system is provided for removing high heat fluxes from surfaces of devices such as micro-electronic chips, metal, mirrors, and lasers. The system uses expanding metastable two-phase flow and a method of controlling the spray for optimum heat flux removal. Control includes spray atomization, fluid-phase, mass flow, and spray temperature.

24 Claims, 5 Drawing Sheets

METHOD AND TWO-PHASE SPRAY COOLING APPARATUS

BACKGROUND OF THE INVENTION

The present invention relates to improved cooling systems for devices that need to be actively cooled to function reliably and efficiently. A primary application of this invention is microelectronic chips, devices, or systems that generate large quantities of heat in small volumes, thereby requiring high heat flux removal techniques. Other applications include rapid quenching of metals, thermal control of mirrors, and cooling of lasers.

As microelectronics continue to develop, there is an increasing trend of performing more functions at a faster rate in a smaller package volume. The net effect is that more heat is generated and it must be removed from a smaller surface area for efficient operation and reliability. It is not only desirable to remove the heat, but also to control the chip temperature independently of ambient conditions. It is well known that in certain microelectronic devices, such as monolithic microwave integrated circuit (MMIC) chips, that by lowering chip temperature, greater throughput may be allowed without damaging the chip and more efficient amplification is possible. These chips find application in electronically scanned active aperture antennas and have potential application in next-generation, electronic warfare systems and other equipment requiring high performance, electronically-steered antennas.

Common heat removal techniques such as conductive heat transfer through the use of heat sinks, natural or forced convective heat transfer, or combinations thereof, limit chip temperature to temperatures slightly above ambient. Active cooling systems provide the flexibility to cool microelectronics to temperatures below ambient and provide high heat flux removal. While there are several high heat flux cooling techniques, the present invention focuses on spray cooling, the advantages of which will become apparent in the following discussion.

There have been numerous investigations into the use of spray cooling for microelectronic systems. In most cases, practical application or systems to control the temperature and spray of the issuing spray have been limited. This is partially due to the lack of understanding of the contributions from each of the mechanisms behind spray cooling that lead to an optimized spray for high heat flux removal.

The first condition for high heat flux spray cooling is atomization of the fluid spray. Prior to spray cooling, early studies were performed using liquid jet impingement, where a narrow jet of fluid is directed upon the cooling surface. Later studies confirm that a finely atomized spray increases the heat flux removal capability of the fluid. Atomized sprays provide a more equal distribution of heat flux thereby maintaining more uniform temperature distributions across the cooling surface and preventing localized hot spots. This in turn prevents burnout and allows for higher critical heat flux, i.e. the point where increasing the temperature difference between the cooling surface and the spray is no longer associated with an increase in heat flux. Additionally, spray cooling allows for lower flow rates for equivalent average heat flux, thus reducing cooling system size. Spray atomization occurs when the magnitude of aerodynamic disruptive forces exceeds the consolidating surface tension forces and stabilizing viscous forces.

A wide variety of spray atomizers exist. Pressure-type atomizers are the most compact and therefore beneficial for compact microelectronics cooling packages. Within pressure-type atomizers, plain orifice and simplex pressure swirl are the most compact, simplistic, and rugged. To enhance spray cooling, several atomization conditions including uniform spray, complete cooling surface coverage, minimal momentum losses, and minimum spray evaporation losses are preferred.

Plain orifice atomizers produce uniform, full cone sprays. Simplex (or pressure-swirl) type atomizers generally produce a hollow cone that can be modified to produce a full cone by using an axial jet or some other device to inject droplets in the center of the hollow conical spray pattern. Hollow cone sprays can potentially lead to burnout at the cone center, whereas, full cone sprays created with axial jets or injections typically produce a bimodal distribution of drop sizes with the droplets at the center of the spray being larger than those near the edge leading to burnout at the spray edge. To prevent burnout, the entire heat-producing surface must be covered. "Simplex" atomizers produce a spray angle that is highly dependent on pressure differential across the nozzle. Practical application would require moving the nozzle axially to maintain c overage with changes in pressure differential or a control system to maintain nozzle pressure differential regardless of other system parameters such as cooling load or heat rejection temperature. Plain orifice atomizers produce a more constant spray angle that is mostly dependent on fluid properties such as viscosity and surface tension as well as turbulence of the issuing spray and therefore do not require axial locational control. Axial momentum improves spray cooling heat transfer by holding a thin liquid layer on the cooling surface. This is particularly important in adverse-gravity environments that may be encountered in space cooling applications or aboard aircraft during flight maneuvers. Therefore, it is desirable to minimize axial momentum losses that are typically increased as the radial spray component increases (i.e. increased spray angle). Plain orifice nozzles have a narrower spray cone (typically 5 to 15 degrees) than simplex nozzles (typically 30 to 180 degrees) and therefore reduced axial momentum losses. Additionally, narrow cone sprays are less susceptible to evaporation due to mixing of ejected liquid droplets and entrained vapor, thus providing more evaporation due to impingement of saturated liquid on the hot surface to be cooled.

These atomization conditions lead to an associated spray property that also enhances spray cooling. Prior art approaches typically use a spray that is "at or near" saturated liquid conditions. This allows for two-phase boiling heat transfer at the heated surface and takes advantage of the high heat transfer associated with latent heat of vaporization. Two-phase heat transfer is typically at least an order of magnitude greater than single phase heat transfer. However, the condition of "at or near" saturated liquid is not optimal. If the spray fluid is slightly subcooled (i.e. only near saturated liquid conditions) then nucleation for boiling must occur at the heated surface. This means the entire process of creating a nucleation site, allowing bubble growth, and removing the bubble to allow new nucleation sites must occur at the chip surface after the liquid droplets impinge on the surface.

It is not only important to initiate nucleation prior to contacting the surface to be cooled, it is also important that a system control the temperature at which this nucleation occurs and a system be capable of accommodating varying heat loads at the desired temperature. For instance, while it is desirable to constrain a spray to a uniformly atomized spray, that is two phase and is issued at an adjustable temperature, practical controls to perform these functions must be incorporated into a complete cooling system. Atomization in pressure-type spray nozzles only occurs if the pressure differential across the nozzle is sufficient.

At very low pressure differentials the flow begins as a "dribble" or "thin distorted pencil". At intermediate pressure differentials additional stages such as "onion" or "tulip" stages may occur prior to fully developed sprays at higher differentials. It is doubtful that the early stages will provide adequate cooling and will most likely lead to premature burnout. Therefore, control of the spray must be incorporated in a practical design. Optimum chip operating temperature may be determined a priori or through the use of chip performance monitoring plus feedback. For instance, high power microwave amplifiers measure efficiency as output power divided by input power. If it is desirable to optimize efficiency, then that value may be fed back to the spray control mechanism until the highest efficiency is achieved. Chip performance may alternatively be measured as the maximum power than can be transmitted through a chip without damaging that chip. If the maximum power is known, then the spray controller may be altered until maximum power is achieved. Finally, a combination of these and other chip performance feedback signals may be used.

U.S. Pat. No. 5,220,804 describes a wide-angle spray cooling system. The apparatus uses a simplex nozzle to spray liquid onto the heated surface. A method of controlling the state of the spray fluid is not disclosed. Other than the spray chamber the remainder of the system is not disclosed.

U.S. Pat. No. 5,412,536, U.S. Pat. No. 5,831,824, and U.S. Pat. No. 5,907,473 all discuss ways of spray cooling electronic systems. In each of these cooling systems the condenser is part of the spray chamber and a liquid pump is used to supply the pressurized liquid to the spray nozzle. This type of system, typically called a "pumped loop" can not control spray temperature below that of ambient temperature. Further, other than U.S. Pat. No. 5,412,536, disclosing that the spray emitted from the nozzle should be saturated liquid (meaning a quality of zero), no method for controlling the spray is given. In our invention, the spray emitted from the nozzle will have some quality, that is it will not be a saturated liquid but rather a combination of saturated liquid and vapor. The fluid has a quality of greater than zero but less than one.

U.S. Pat. No. 4,912,600 and U.S. Pat. No. 5,183,104 disclose spray cooling systems that use a vapor compression cycle, thus allowing spray temperatures to be below that of the ambient or heat rejection temperature. In the latter patent, a liquid is used in the impinging jet, and the "cooling liquid should be preferable at or near its vaporization temperature when it impinges on the hot objects." This approach did not realize that the fluid should be saturated with a quality greater than zero (and less than one), that is the inlet fluid enthalpy should be selected or controlled so that after the pressure drop in the orifice the fluid is nucleating (due to the expansion) before it contacts the surface or environment to be cooled.

In these patents, the spray cooling chamber therein does not fully vaporize the refrigerant, resulting in the need for a downstream evaporator to fully evaporate the refrigerant vapor prior to compression. In addition to the extra hardware of such a conventional configuration, the coefficient of performance of the cooling system is reduced because not all the potential cooling is utilized in cooling the objects to be cooled via the spray cooling. The cooling provided by the downstream evaporator is not available for spray cooling in this configuration and represents lost cooling potential. It does not utilize all the potential cooling in the spray cooling chamber or recognize how to eliminate the downstream evaporator. Likewise the former patent also requires the downstream evaporator to completely vaporize the working fluid prior to compression and again is configured to spray liquid on the object to be cooled, as reflected in the statement "in operation spraying the liquid coolant on one or both sides of the silicon wafers . . . ."

Both of these known systems use an evaporator external to the microelectronics cooling chamber to evaporate any remaining fluid and prevent liquid slugging at the compressor. In addition to the excess size and weight of the evaporator and compressor, this method is inefficient.

SUMMARY OF THE INVENTION

Therefore, in light of our discovery of the benefits of saturated two-phase spray cooling, as well as in view of the afore-mentioned shortcomings in the prior art, our invention has the following objectives.

One object is to provide a single or multiple component two-phase fluid spray for cooling equipment that requires high heat flux removal. As opposed to the prior art that uses subcooled liquid or saturated liquid sprays that develop boiling nucleation sites at the surface to be cooled, the current spray is a saturated two-phase spray that includes nucleation sites prior to impingement on the cooling surface, thereby increasing heat flux, and reducing the wall superheat.

Another object is to provide a nozzle, capable of producing a narrow cone angle spray, which atomizes the fluid with the primary momentum in the axial direction of the spray. A narrow cone angle improves the uniformity of heat flux across the cooling surface.

A further objective is to utilize the adiabatic nucleation in the nozzle to provide additional liquid acceleration and increase the momentum in the axial direction of the spray. Homogeneous nucleation due to the isenthalphic vaporization improves the uniformity of spray droplets and thus the uniformity of the heat flux across the cooling surface.

A still further object is to control the spray to ensure that it is atomized and saturated two-phase and therefore to gain the benefits of uniform evaporative spray cooling with nucleation sites already formed.

Yet another object is to provide a spray cooling configuration that does not require an additional downstream evaporator. The cooling chamber serves as the sole evaporator, and flow rate is controlled to match the load, thereby producing a more compact and efficient cooling system.

Another object is to control the vapor compression system so that spray phase and temperature are controlled independently, thereby optimizing electronics performance.

Other objects, advantages and novel features of the present invention will become apparent from the following detailed description when considered in conjunction with the accompanying drawings herein.

DETAILED DESCRIPTION OF THE DRAWINGS

Figure 1:
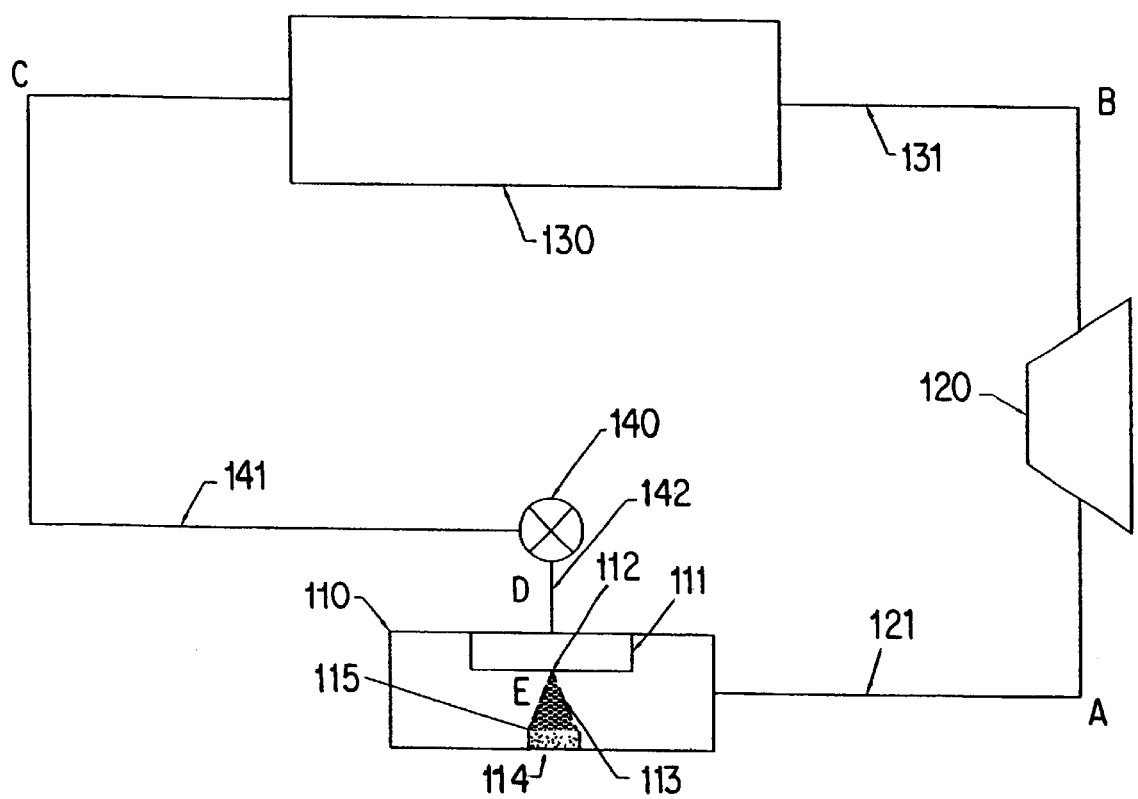
FIG. 1 is a schematic diagram of the complete spray cooling system of the present invention.

FIG. 1 is a schematic depiction of the overall spray cooling system according to the present invention. The spray cooling chamber 110 houses the spray manifold 111, the atomizing nozzles 112, the two-phase spray 113, and the electronic chip 114. After contacting the hot surface 115 of the chip 114, the superheated vapor fluid is collected and returned to the compressor 120 via suction line piping 121. The compressor increases the pressure and thus the saturation temperature of the fluid to a temperature above ambient or heat rejection temperature, thereby allowing the fluid to be condensed in the condenser 130. Energy added to the fluid by the work of compression and energy removed from the chip 114 is rejected in a condenser 130 receiving the fluid from the compressor 120 via line 131. The condenser 130 may preferably perform a certain amount of subcooling before the liquid continues to the expansion valve 140 via liquid line 141. The expansion valve 140 may be a manual valve, capillary tube, or orifice plate that is set to provide a predetermined throttling without any feedback control, a thermostatic expansion valve which adjusts it position to maintain a predetermined exit superheat (from the spray cooling chamber), or for optimal control, an electronically controlled expansion valve which can be adjusted based of any number of pressure, temperature, or performance measurements. The inlet subcooled liquid is expanded in the expansion valve 140, effectively lowering the fluid pressure adiabatically. Depending on the inlet enthalpy and the amount of pressure drop, the fluid exiting the expansion valve 140 through line 142 could be either saturated or subcooled. If the pressure drop has been enough to result in a two-phase exit condition, flash evaporation of some of the fluid would occur (the enthalpy of the fluid remains constant) and this results in a lowering of the fluid temperature. The fluid exits the expansion valve 140 and is supplied to the manifold 111 where it is distributed to one or more atomizing nozzles 112 where the pressure is again lowered adiabatically. Flash evaporation of some of the fluid occurs (the enthalpy of the fluid remains constant) and this results in a lowering of the fluid temperature exiting the nozzles 112. The additional pressure drop through the nozzles, the homogeneous nucleation of some of the fluid (because of the isenthalpic expansion), and the fluid acceleration due to the lower density of the vapor (and therefore the required acceleration of the liquid to maintain the mass flow rate) all contribute to the development of a well atomized, uniformly distributed spray of droplets. This configuration ensures that the spray is two-phase thus providing nucleation sites within the spray prior to contacting the hot chip surface.

Figure 2A:
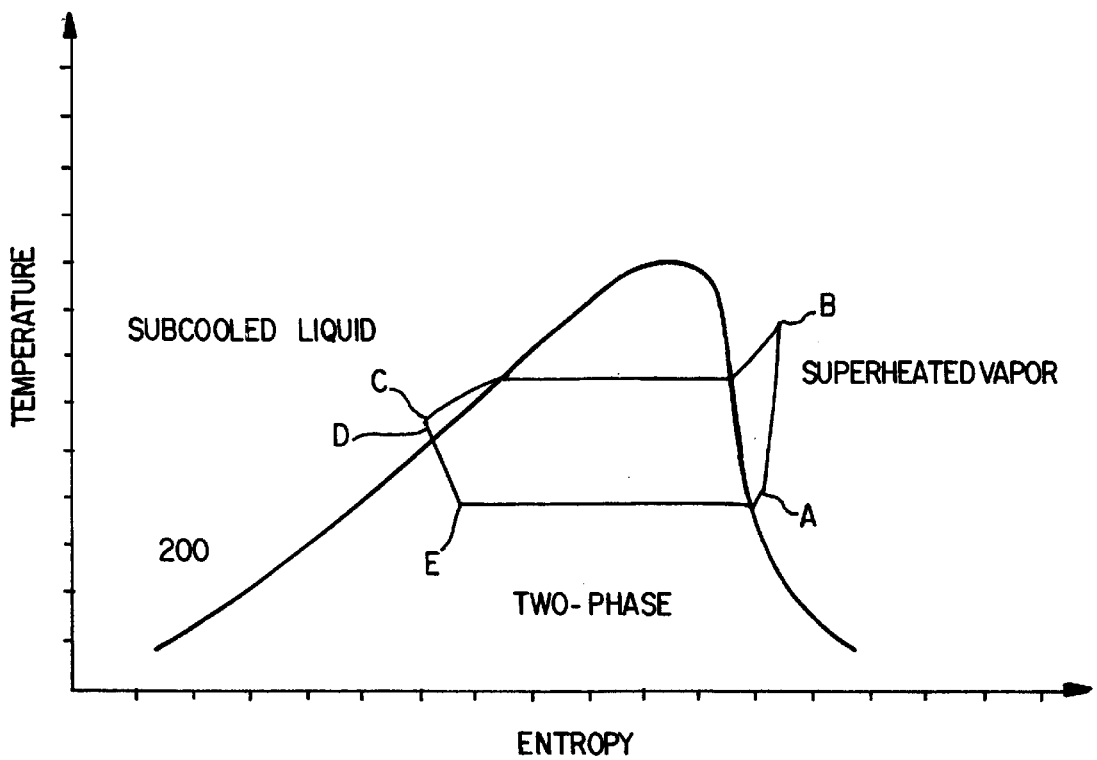
FIG. 2a is a temperature-entropy plot of the cooling fluid throughout the cycle.

FIG. 2a is a temperature—entropy diagram of the cooling cycle. The letters correspond to the letter-designated locations shown in FIG. 1. Curve 200 is representative of a typical saturation curve for a fluid. Saturated, subcooled and superheated regions of this figure have been identified.

Figure 2B:
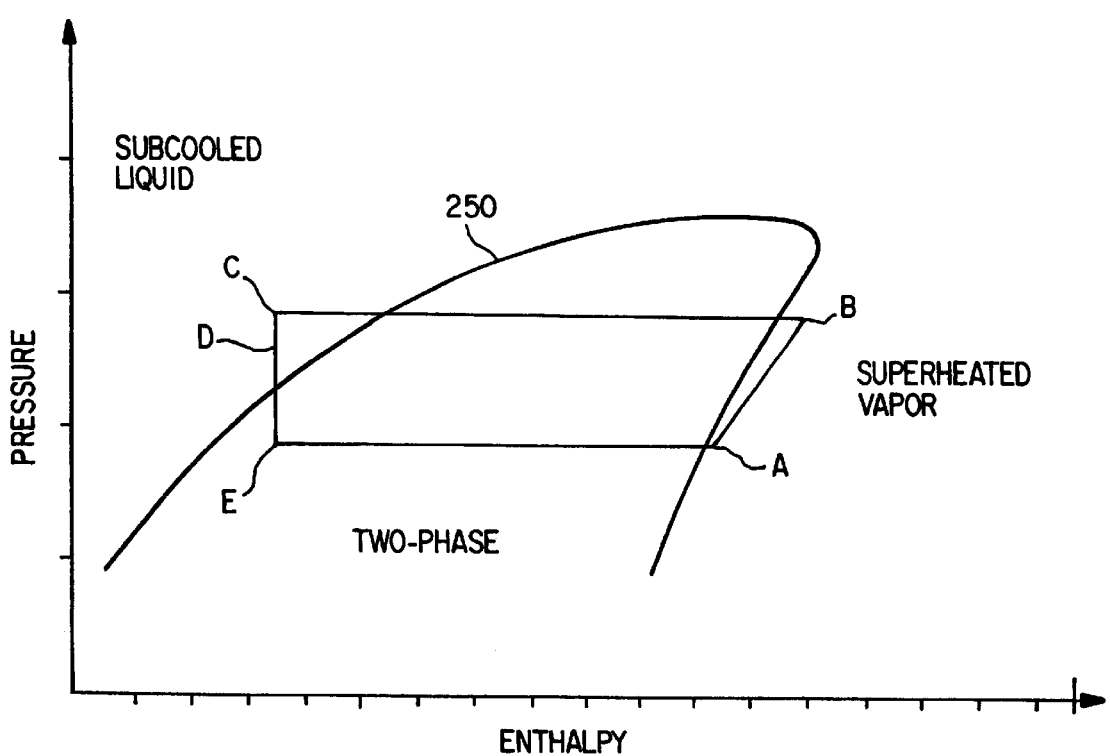
FIG. 2b is a pressure-enthalpy plot of the cooling fluid throughout the cycle.

FIG. 2b is a pressure—enthalpy diagram of the cooling cycle. Once again, the letters correspond to the letter-designated locations shown in FIG. 1 and curve 250 is representative of a typical saturation curve for a fluid. As shown in FIG. 2b, the inlet fluid at state D is selected so that after an adiabatic expansion in the orifice, the fluid exits in a two-phase condition, with a quality greater than zero and less than one. The fluid is nucleating due to the drop in pressure in the orifice, prior to impinging on the surface that is to be cooled. In this way, the nucleation site is created adiabatically in the spray, without any requirement for heat addition from the surroundings and before the fluid contacts the hot surface. Since nucleation has been initiated before contacting the heater surface more rapid boiling and decreased wall superheat occurs. The resulting bubbles must then only be removed by the momentum of the spray or locally re-condensed into the thin fluid layer. Further, because the fluid begins to nucleate in the spray, this evaporation (to a lower density vapor) results in an acceleration of the resulting fluid (since mass must be conserved) . Increasing droplet velocity further increases the heat flux due to the forced convective term.

Figure 3:
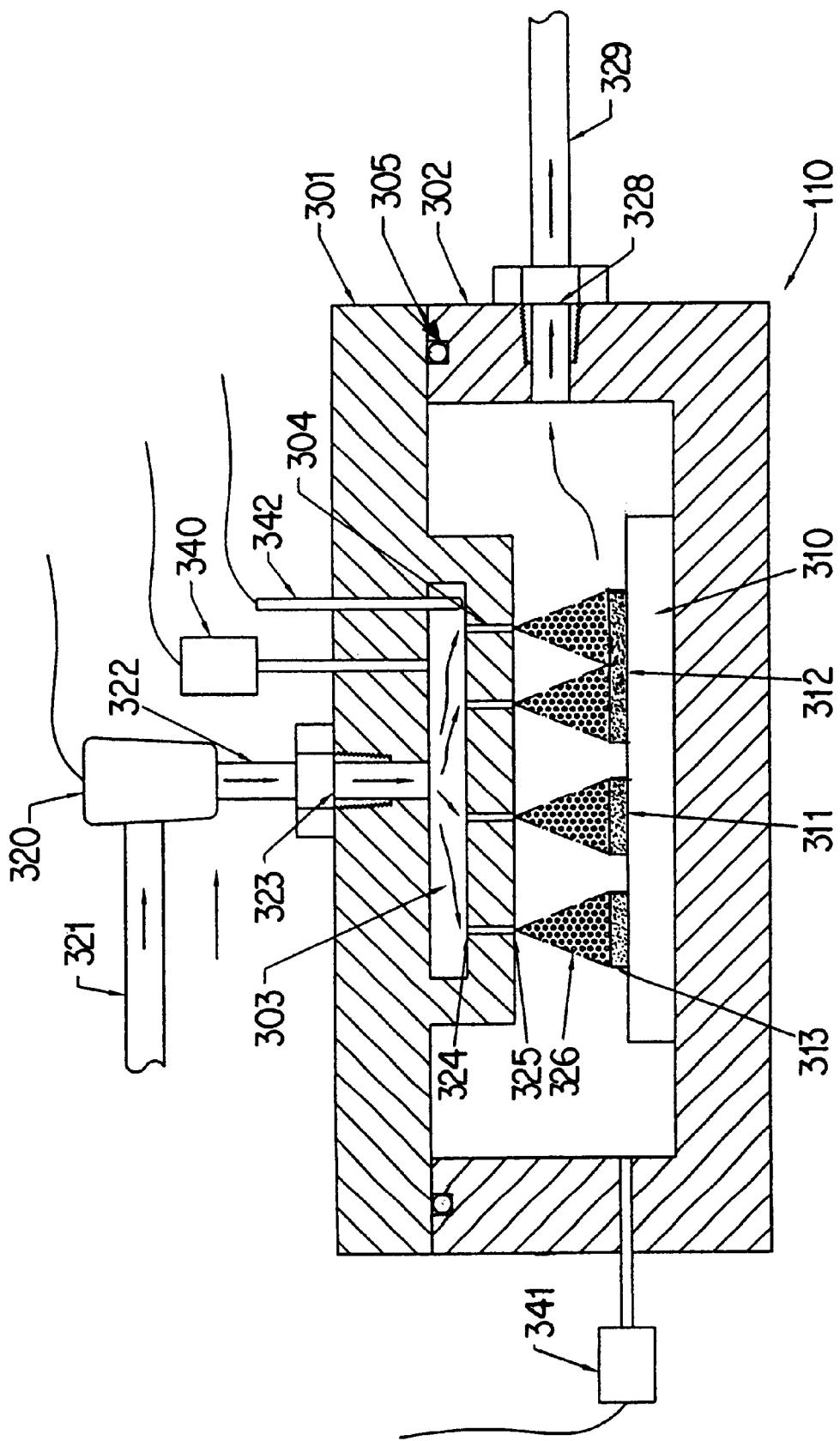
FIG. 3 is a cross-sectional detail of the spray cooling chamber in which the flow path of the cooling fluid is shown through the control valve, cooling chamber inlet port, manifold, atomizing nozzles, microelectronic chip surface, and cooling chamber exit port.

FIG. 3 is a cross sectional detail of the spray cooling chamber 110 of the present invention. In the currently preferred embodiment, the chamber has an upper housing 301 and a lower housing 302 that completely encompass the electronic chip module 310. The upper housing 301 contains a spray manifold 303 which distributes the saturated or subcooled fluid to one or more atomizing nozzles 304. The nozzles are preferably plain orifice nozzles although other types of nozzles may be used. A seal, such as an 0-ring 305 or gasket is used to prevent the fluid from leaking out of the chamber 110. The lower housing 302 includes a conventional device for securely mounting the object to be cooled and an outlet 328 for the heated fluid to be returned via line 329 to the compressor inlet. An object being cooled could be a microelectronic device, such as a multi-chip electronic module 310 containing multiple electronic chips 311 and 312 of various sizes and configurations. When cooling electronic chips, the heat produced by the chip is typically concentrated at the upper surface 313 of the chip and this is the preferred surface to be exposed to the two-phase spray 326. For electronic cooling of chips with exposed leads or exposed electrical surfaces, the cooling fluid must have a high dielectric constant (otherwise the fluid may short circuit the chip causing it to fail).

We have discovered that the key to providing optimal cooling is controlling the spray issued from the nozzles. This function is performed by the expansion valve 140 in conjunction with the configuration of the spray nozzles 304. While a variety of expansion valves are contemplated, a conventional electronic expansion valve provides the most flexible control. For optimal heat flux, the expansion valve 320 connected to the condenser 130 via line 321 and to the chamber 310 via line 322 must provide four functions.

First, the expansion valve must ensure that the spray is atomized as it leaves the nozzle exit 325. This is performed by measuring the pressure difference between the manifold pressure using pressure gauge 340 and the chamber pressure using pressure gauge 341 and ensuring that the difference is greater than the predetermined pressure required for atomization. If the pressure differential is not sufficient, control valve 320 must be adjusted to increase the pressure drop from the nozzle inlet 324 by decreasing the valve opening.

Second, the control valve 320 must ensure that the spray leaving the nozzle exit is a two-phase mixture, thereby providing nucleation sites in the spray prior to the spray contacting the chip surface 313. This is achieved by determining the fluid state in the manifold and comparing it the pressure in the chamber. For example, if the fluid in the manifold is saturated, then the pressure drop across the nozzle, will cause a two-phase exit spray from the nozzle. If the fluid in the manifold is a subcooled liquid, however, then the pressure drop across the nozzle 304 must be sufficient to produce a saturated two-phase exit fluid in the nozzle. Since the pressure drop across the nozzle is not a directly controllable value, for those cases where a controllable expansion device is used (such as a thermal expansion valve or electronic expansion valve), the expansion device must be set to assure proper upstream conditions at the inlet 324 to the orifice or nozzle 304 and to assure two phase conditions at the outlet 325 of the nozzle.

The third and fourth conditions are controlled simultaneously and are closely coupled. The control valve 320 is used to control the mass flow rate of the spray and the spray temperature. The mass flow is regulated so the cooling capacity matches the load of the electronic chips; the mass flow can be regulated by varying the speed of a compressor, or by utilizing a hot-gas by-pass as described in U.S. Pat. No. 5,862,675. Cooling capacity can also be regulated by a condenser by-pass as described in U.S. Pat. No. 6,205,803. The spray temperature is regulated to maintain optimum chip operating temperature by regulating the suction side pressure. The optimum chip operating temperature may be determined a priori or through chip performance feedback.

Figure 4:
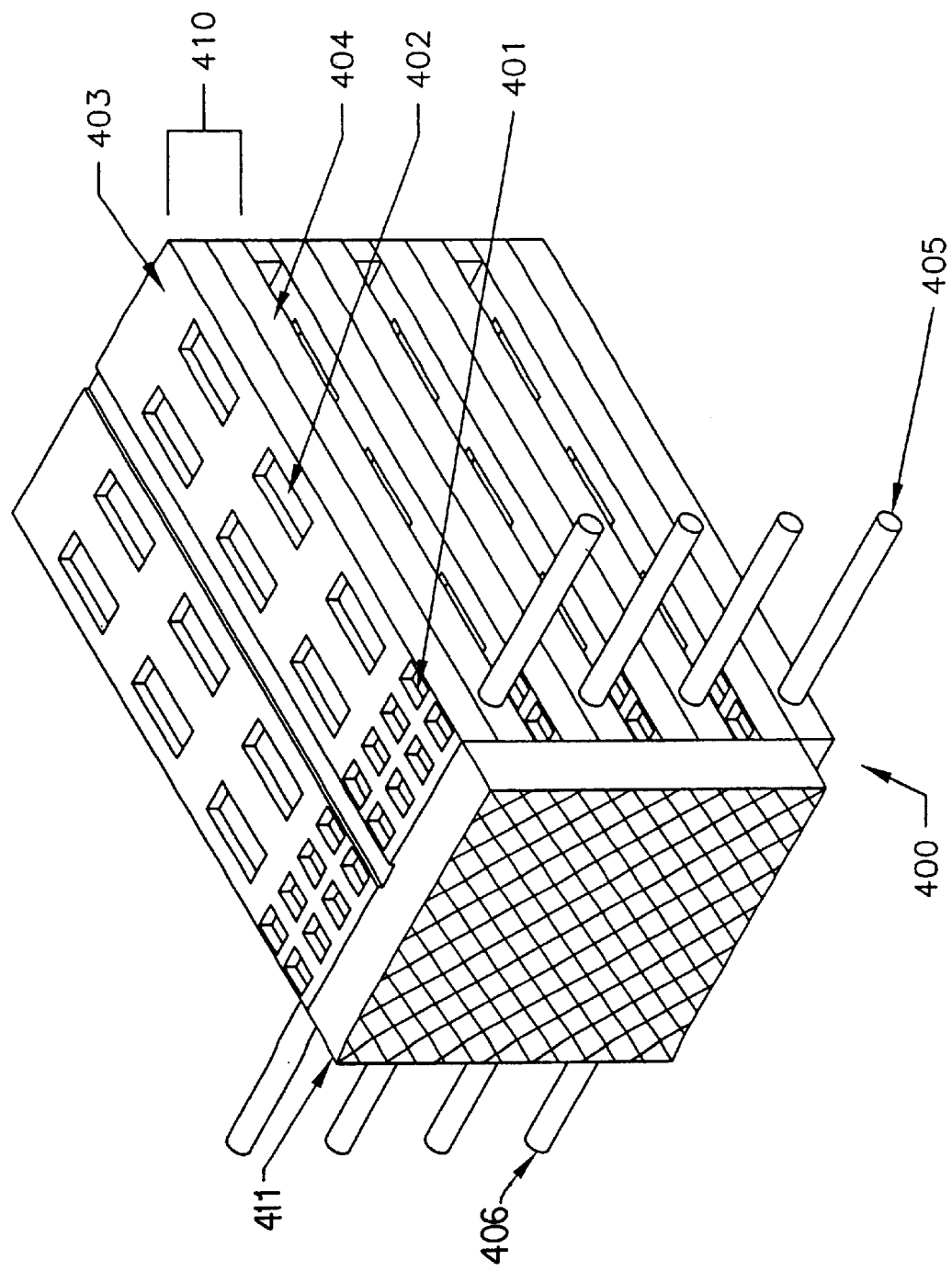
FIG. 4 is a perspective view of a prior art actively cooled transmit array.

FIG. 4 is prior art device showing a cooling scheme for high power amplifier chips located on stacked, multi-chip modules and forming a transmitter array 400. Typically, multiple high-powered amplifier chips 401 and multiple low-powered electronics 402 coexist on a multi-chip module 403. A thick heat sink 404 manufactured from a highly conductive material such as aluminum spreads the heat generated by the high-power chips. Cooling passages internal to the heat sink circulate a fluid that enters at each inlet port 405 and exits at each outlet port 406. The heat generated at the top of the chip surface at the chip gate must pass through several layers of chip material and substrate before reaching the heat sink and cooling fluid. Between each layer contact resistance reduces the effective conduction and overall heat flux. The combined multi-chip module and heat sink is considered a stick 410, of which multiple sticks can be stacked to form a complete transmitter array. The size and configuration of the transmitter antennae 411 formed by multiple sticks 410 is critical to the application.

Figure 5:
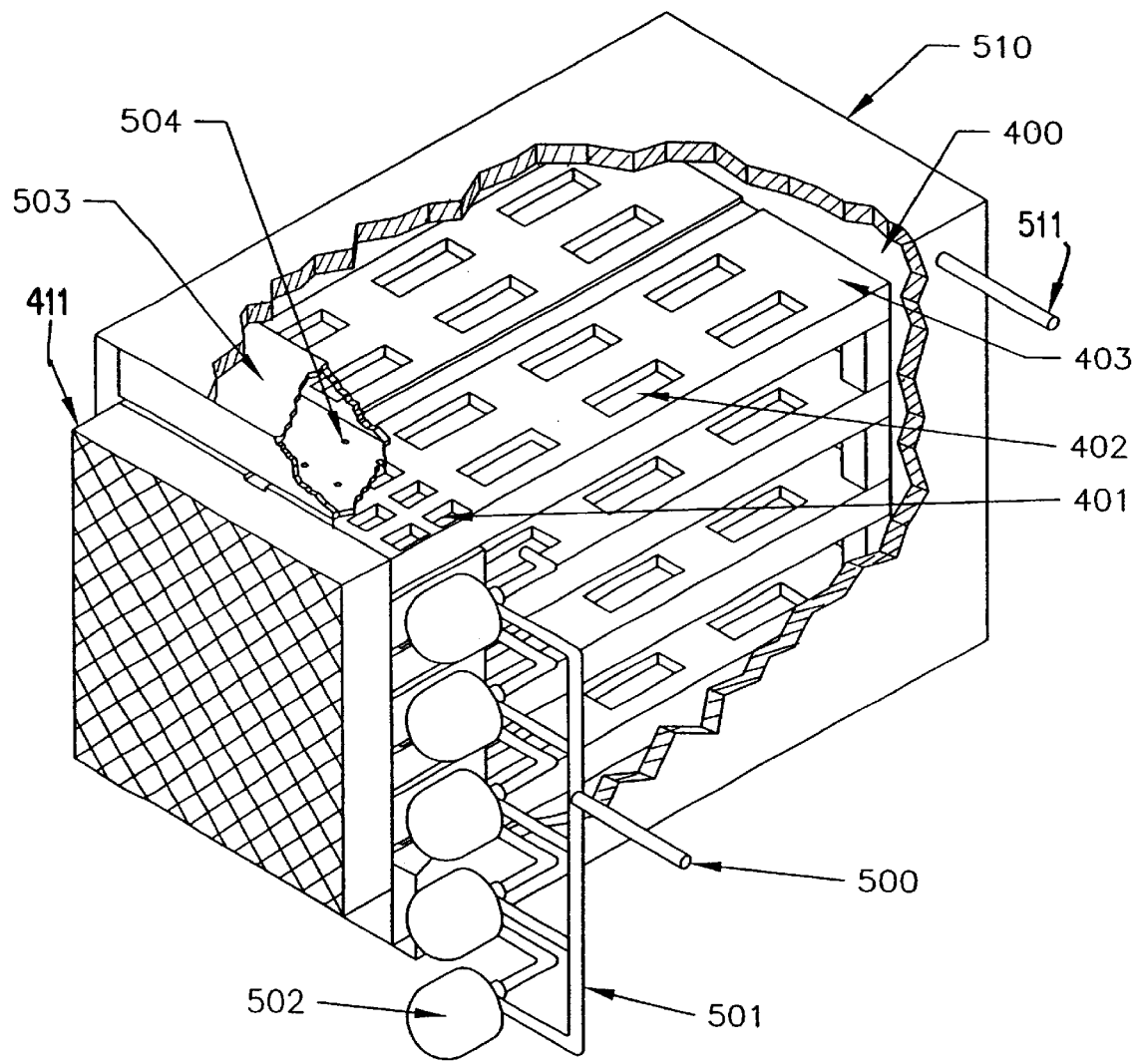
FIG. 5 is a currently preferred embodiment of a two-phase, spray-cooled transmit array according to the present invention.

FIG. 5 is a currently preferred embodiment of a spray cooling system for the same transmitter array 400 shown in FIG. 4. The same multi-chip module 403 containing the same high-power amplifier chips 401 and low-power electronics 402, is the same size and configuration as FIG. 4 thus preserving the transmitter antenna 411. Only the high-power amplifier chips generate sufficient heat to require high heat flux removal techniques, i.e. spray cooling. The low-power electronics can be cooled by convection of the spray fluid after it leaves the high-power chips. By placing spray nozzles above only the chips that require high heat flux removal, system weight is reduced. Spray fluid received from the condenser via piping 500 enters a control valve manifold 501 where it is distributed to multiple control valves 502. The fluid then flows through each spray manifold 503 where it is distributed to an array of one or more spray nozzles 504. The issuing spray, which is finely and uniformly atomized and two-phase, efficiently cools the high power amplifier chip 401 on the upper surface where the heat is generated. Forced convection, boiling heat transfer removes the heat and evaporates the fluid to a vapor. Because the chips operate at a cooler level than possible with the prior art, they are more efficient and reliable. The vapor removes additional heat generated by the low-power electronics before being collected in a chip chamber 510 and continuing to the compressor through the chamber outlet port 511. The preferred embodiment maintains the same transmitter antennae size and configuration while reducing weight and improving efficiency and reliability.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A spray cooling apparatus, comprising a device configured to produce a saturated two-phase spray from a fluid so as to generate nucleation prior to impingement on a surface to be cooled.

2. The apparatus according to claim 1, wherein the device includes a nozzle configured to provide a narrow cone angle spray and to atomize the fluid such that a primary momentum is provided in an axial direction of the spray.

3. The apparatus according to claim 1, wherein the device includes at least one nozzle configured to generate the nucleation of the fluid therein so as to provide further acceleration and momentum in an axial direction of the spray.

4. The apparatus according to claim 1, wherein the device includes a chamber, a spray manifold operatively located within the chamber, and at least one atomizing nozzle configured to produce the two-phase spray directed toward a heated surface of a component in the chamber.

5. The apparatus according to claim 4, wherein a compressor is operatively associated with the device to receive the fluid and increase the pressure and saturation temperature of the fluid to allow the fluid to be condensed in a condenser.

6. The apparatus according to claim 5, wherein an expansion valve is operatively connected to the spray manifold, and the condenser is arranged to perform condensation and heat rejection of the fluid prior to supplying the fluid to the expansion valve.

7. The apparatus according to claim 6, wherein the expansion valve is selected from a group consisting of a manual valve, a capillary tube, an orifice plate with predetermined throttling, an adjustable thermostatic expansion valve and an electronically controlled expansion valve.

8. The apparatus according to claim 6, wherein the expansion valve is operatively connected with the manifold such that pressure of fluid exiting the expansion valve is changed sufficiently to lower temperature of the fluid whereby the lower temperature fluid is supplied to the manifold for distribution.

9. The apparatus according to claim 6, wherein the at least one nozzle is configured to lower pressure of the fluid received in the manifold from the expansion valve whereby homogeneous nucleation of a portion of the fluid and acceleration of the fluid develop a uniformly distributed spray of metastable two-phase atomized droplets.

10. The apparatus according to claim 4, wherein a chamber comprises an upper housing containing the manifold and a lower housing such that the housings completely surround a thing to be cooled in a sealing manner.

11. The apparatus according to claim 10, wherein the at least one atomizing nozzle is a plain orifice nozzle arranged to direct the spray at the desired location with respect to the thing to be cooled.

12. A method for spray cooling a thing generating large quantities of heat, comprising; measuring a pressure difference between a manifold pressure and a chamber pressure, passing cooling fluid through an expansion valve, and at least one nozzle located in a manifold, controlling the expansion valve to maintain the pressure difference at a level which ensures atomization of the fluid as it exits from the at least one nozzle, and maintaining the atomized fluid exiting the at least one nozzle as a two-phase liquid-vapor mixture to provide boiling nucleation prior to contact of the spray with the thing to be cooled.

13. The method according to claim 12, wherein the controlling of the expansion valve includes substantially simultaneous control of spray mass flow rate for regulating cooling capacity to match a load of the thing to be cooled and of spray temperature to maintain optimum operating temperature of the thing to be cooled.

14. The method according to claim 13, wherein the optimum operating temperature is one of preselected and determined via a feedback operation.

15. The method according to claim 13, wherein the spray mass flow rate is regulated by one of varying speed of a compressor, utilizing condensor bypass and utilizing a hot-gas bypass.

16. The method according to claim 15, wherein the optimum operating temperature is one of preselected and determined via a feedback operation.

17. A spray cooling system for an electronics array, comprising a multi-chip module having a plurality of electronic chips, and a device configured to produce a saturated two-phase metastable spray from a cooling fluid so as to contain nucleation prior to impingement on surfaces of the chips.

18. The system according to claim 17, wherein the device includes at least one nozzle which produces nucleation of the fluid therein so as to provide further acceleration and momentum in an axial direction of the spray.

19. The system according to claim 18, wherein the at least one nozzle is located to face a chip surface of each chip.

20. The system according to claim 18, wherein low-power electronics provided in the array are cooled by the cooling fluid of the metastable spray.

21. The system according to claim 17, further comprising a condenser, a control valve manifold operatively connected with the condenser to receive the fluid from the condenser, a plurality of control valves operatively associated with the control valve manifold for distribution of the fluid to the control valves, and the device having a plurality of nozzle manifolds associated with a respective one of the control valves to distribute the fluid to the at least one nozzle in each of the nozzle manifolds to produce the two-phase spray so as to be finely and uniformly atomized before contacting the surfaces.

22. The apparatus according to claim 1, wherein the spray is saturated so as to have a quality between zero and one.

23. The method according to claim 12, wherein the atomized fluid is saturated so as to have a quality between zero and one.

24. A cooling system, comprising a surface to be cooled, and means for producing a saturated two-phase cooling spray from a fluid so as to attain nucleation in the spray prior to impingement on the surface to be cooled.

* * * * *